US006288556B1

United States Patent
Sato et al.

(10) Patent No.: US 6,288,556 B1
(45) Date of Patent: *Sep. 11, 2001

(54) METHOD OF ELECTRICAL MEASUREMENT OF MISREGISTRATION OF PATTERNS

(75) Inventors: Takashi Sato, Fujisawa; Keita Asanuma, Yokkaichi, both of (JP); Junichiro Iba, Mohegan Lake, NY (US); Toru Ozaki, Tokyo (JP); Hiroshi Nomura, Kawasaki (JP); Tatsuhiko Higashiki, Fujisawa (JP)

(73) Assignee: Kabushiki Kaisha Toshiba, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/204,309

(22) Filed: Dec. 3, 1998

(30) Foreign Application Priority Data

Dec. 5, 1997 (JP) .................................................. 9-335903

(51) Int. Cl.$^7$ .................................................. G01R 27/14
(52) U.S. Cl. .................................................. 324/715; 324/713
(58) Field of Search .................................................. 324/713, 158.1, 324/699, 715, 765, 716

(56) References Cited

U.S. PATENT DOCUMENTS

| | | | |
|---|---|---|---|
| 4,399,205 | * 8/1983 | Bergendahl | 430/30 |
| 4,413,271 | * 11/1983 | Gontowski et al. | 357/40 |
| 4,475,811 | * 10/1984 | Brunner | 355/133 |
| 4,782,288 | * 11/1988 | Vento | 324/158 R |
| 4,893,606 | * 1/1990 | Paur | 324/65 R |
| 5,510,722 | * 4/1996 | Seavey | 324/758 |
| 5,575,076 | * 11/1996 | Creeden | 33/620 |
| 5,602,492 | * 2/1997 | Cresswell et al. | 324/763 |
| 5,699,282 | * 12/1997 | Allen et al. | 364/571.01 |
| 5,857,258 | * 1/1999 | Penzes et al. | 29/846 |

FOREIGN PATENT DOCUMENTS 1-179417    7/1989   (JP) .

OTHER PUBLICATIONS

Ivor J. Stemp et al. "Automatic Testing and Analysis of Misregsitrations Found in Semiconductor Processing" Transactions on Electronic Devices, vol. 26, No. 4, pp. 729–732, Apr. 1997.

Junichiro Iba et al. "Electrical Characterization of Across–Field Lithographic Performance for 256 bit DRAM Technologies" SPIE vol. 2512, pp. 218–225, Apr. 1995.

M. W. Cresswell et al. "Electrical Test Structure for Overlay Metrology Referenced to Absolute Length Standards" SPIE vol. 2196, pp. 512–521, 1994, No month available.

* cited by examiner

*Primary Examiner*—Safet Metjahic
*Assistant Examiner*—Vincent Q. Nguyen
(74) *Attorney, Agent, or Firm*—Finnegan, Henderson, Farabow, Garrett & Dunner, L.L.P.

(57) ABSTRACT

The invention allows for measurement at the same density as an actual device pattern and measures the level of registration of actual patterns with precision. In the measurement of the invention, a first exposure process is performed on a first-level pattern and a second exposure process is then performed on a second-level pattern. After that, the patterns are developed and etched, thereby forming two patterns of different shapes. Next, the resistance between terminals of a pattern which are obtained by means of etching is measured through a four-point measurement. An amount of misregistration of the first-level pattern and the second-level pattern is calculated from the measured resistance.

6 Claims, 6 Drawing Sheets

METHOD OF ELECTRICAL MEASUREMENT OF MISREGISTRATION OF PATTERNS

BACKGROUND OF THE INVENTION

The present invention relates to a lithographic technique and more specifically to a method of electrically measuring misregistration used in measuring misregistration errors.

Conventionally, the misregistration of exposure processes for fabricating semiconductor devices is measured in terms of electrical resistance values of a pattern for measuring the amount of misregistration.

For example, in the paper entitled "Automatic Testing and Analysis of Misregistrations Found in Semiconductor Processing" by I. J. STEMP, K. H. NICHOLAS, and H. E. BLOCKMAN, IEEE TRANSACTIONS ON ELECTRON DEVICES, Vol. ED-26. No. 4, pp. 729 to 732, April 1979, it is concluded that the misregistration measurement precision is 20 nm and this precision will suffice.

However, taking into consideration the design of recent semiconductor devices, the measurement precision needs to be at least 5 nm. For semiconductor devices of the future, the measurement precision will need to be 1 nm. Therefore, there is a need for some idea that allows for measurements at precision higher than the present level.

The aforementioned technique expects an improvement in measurement precision through resistance measurement based on four-point measurements; however, no four-point measurement is actually used and no measurement pattern is presented.

Due to the aberration of the projection optical system, the pattern will shift its transferred location according to its density level. In the aforementioned technique, an isolated pattern is used to measure an amount of misregistration and its density differs from that of an actual device pattern. For this reason, the measured value will not be trustworthy.

BRIEF SUMMARY OF THE INVENTION

It is therefore an object of the present invention to provide a method of electrically measuring misregistration in a semiconductor device which allows a measurement to be made at the same density as in an actual device pattern and the level of registration of actual patterns to be measured with higher precision.

According to an aspect of the present invention there is provided a method of electrically measuring misregistration of patterns comprising a first step of forming a first-level measurement pattern and then forming a second-level measurement pattern on the first-level measurement pattern, a second step of measuring electrical resistance between terminals provided in either the first-level measurement pattern or the second level measurement pattern, and a third step of calculating an amount of misregistration between the first-level measurement pattern and the second-level measurement pattern from the measured resistance value, characterized in that in the first step, at least one of the first-level measurement pattern and the second-level measurement pattern is formed so that it has at least two pattern elements.

According to another aspect of the present invention there is provided a method of measuring misregistration of patterns comprising: a first step of a first-level measurement pattern; a second step of forming a second-level measurement pattern on the first-level measurement pattern; a third step of measuring electrical resistance between terminals provided in either the first-level measurement pattern or the second-level measurement pattern; and a fourth step of calculating an amount of misregistration between the first-level measurement pattern and the second-level measurement pattern from the measured electrical resistance, and wherein in the first or second step, at least one of the first-level measurement pattern and the second-level measurement pattern is formed so that it has at least two pattern elements, and each of the measurement patterns has separate patterns for displacement in the plus direction and displacement in the minus direction.

According to sill another aspect of the present invention there is provided a method of electrically measuring misregistration of patterns comprising a first step of forming a first-level measurement pattern and then forming a second-level measurement pattern on the first-level measurement pattern, a second step of measuring electrical resistance between terminals provided in either the first-level measurement pattern or the second level measurement pattern, and a third step of calculating an amount of misregistration between the first-level measurement pattern and the second-level measurement pattern from the measured resistance value, characterized in that in the first step, at least one of the first-level measurement pattern and the second-level measurement pattern is formed so that it has at least two pattern elements, and the second-level measurement pattern is divided in the lengthwise direction of the first-level measurement pattern into a main pattern element and subpattern elements.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Before describing the embodiments of the present invention, reference will be made first to FIG. 1 to describe the principle of measuring misregistration based on the four-point measurement.

Figure 1:
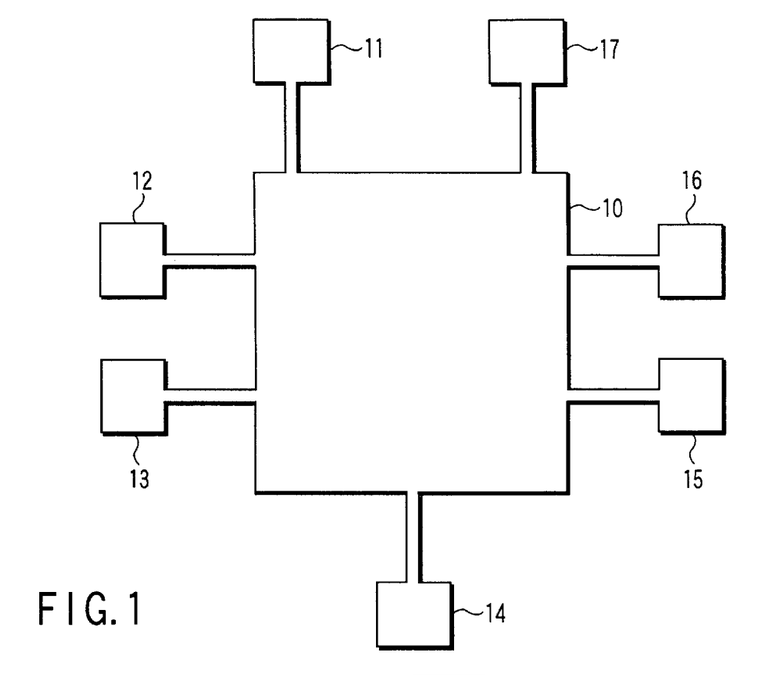
FIG. 1 illustrates a first-level pattern for use in explanation of the principles of registration measurement based on a four-point measurement.

As shown in FIG. 1, a pattern 10 of conductive film is formed as a first-level pattern. The pattern is formed with a plurality of terminals 11 through 17 serving as electrodes so that they extend from the pattern 10.

Figure 2:
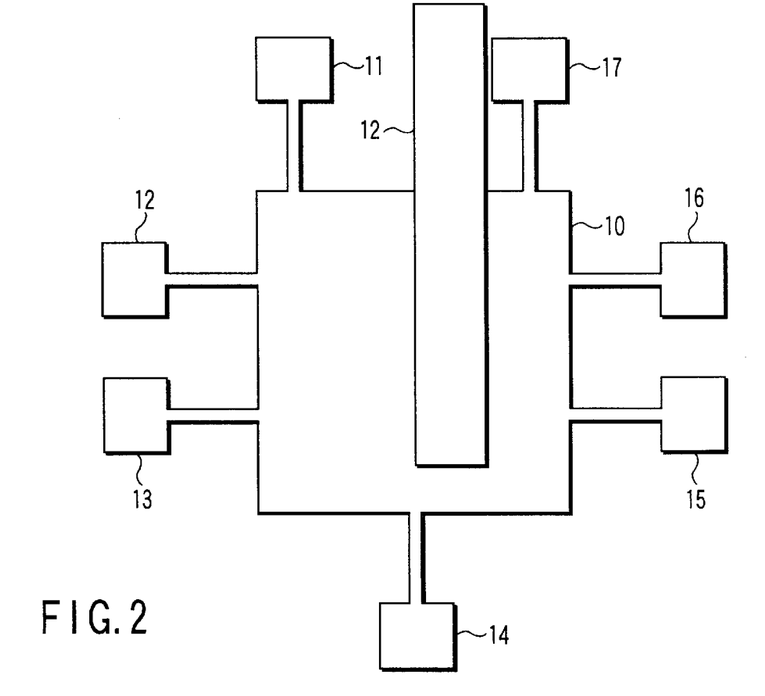
FIG. 2 illustrates the state where a second level pattern is registered onto the first-level of pattern.

Next, a second-level pattern 12 is transferred as a trimming pattern onto the first-level pattern 10 as shown in FIG. 2.

At this point, a portion of the first-level pattern 10 which is trimmed by the second-level pattern 12 should be located in the center between the terminals 12 (13) and 16 (15). In FIG. 2, however, due to the presence of misregistration, the trimmed portion of the first-level pattern is formed in the location offset from the center of the pattern 10 (in this example, displaced to the right of the center of the pattern 10).

Here, let the distance and the resistance between the terminals 12 and 13 be lm and Rm, respectively, the distance and the resistance between the terminals 15 and 16 be lp and Rp, respectively, the sheet resistance be ρ, and the amount that the pattern 12 is offset from the center of the pattern 10 be Δx. Then, the following equation holds:

$$\Delta x = \tfrac{1}{2}(\rho((lm/Rm)+lp/Rp))) \quad (1)$$

Thus, by measuring the resistance values Rm and Rp, the amount that the second-level pattern 12 is misregistered with respect to the first-level pattern 10 can be known.

In order to determine accurately the amount of misregistration of the second-level pattern 12 with respect to the first-level pattern 10, it is required to measure the resistance values with precision. To this end, the four-point measurement is used to measure the resistance values.

For example, assume that the terminal 17 is grounded, a current Im is supplied from the terminal 11, and a current Ip is supplied from the terminal 14. Then, voltages Vm and Vp are developed between the terminals 12 and 13 and between the terminals 15 and 16, respectively, which are represented by $$Rm = Vm/Im \quad (2)$$

$$Rp = Vp/Ip \quad (3)$$

Substituting equations (2) and (3) into equation (1) yields $$\Delta x = \tfrac{1}{2}(\rho((lm\,lm/Vm)+(lp\,lp/Vp))) \quad (4)$$

Thus, by measuring the voltages Vm and Vp and the currents Im and Ip, the amount of misregistration, Δx, can be determined. Alternatively, assuming that a common current I is supplied between the terminals 11 and 14 with the terminal 17 unused, equation (4) becomes $$\Delta x = \tfrac{1}{2}(\rho\,I((lm/Vm)+(lp/Vp))) \quad (5)$$

This approach can determine the amount of misregistration Δx.

The present invention is implemented on the basis of such principles.

Figure 3:
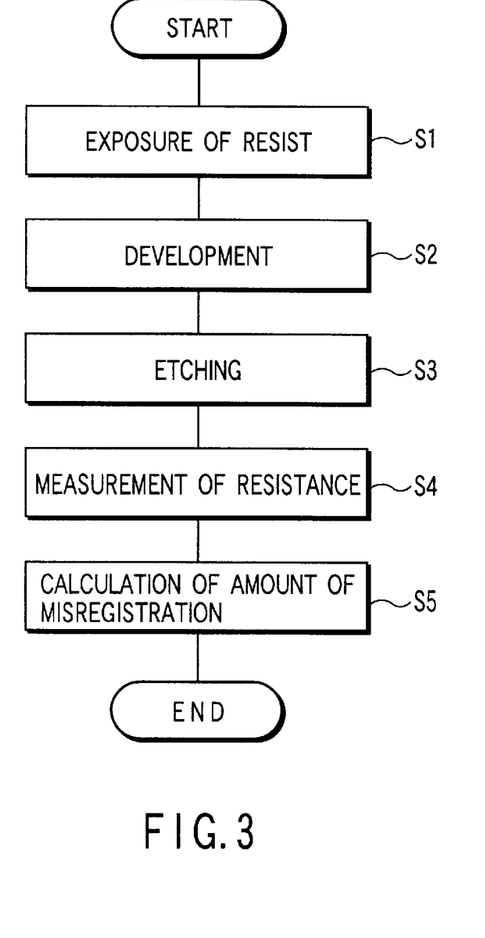
FIG. 3 is a process flow illustrating a method of electrically measuring the misregistration of patterns according to a first embodiment of the present invention.

Hereinafter, a first embodiment of the present invention will be described with reference to FIGS. 3, 4 and 5.

Figure 4:
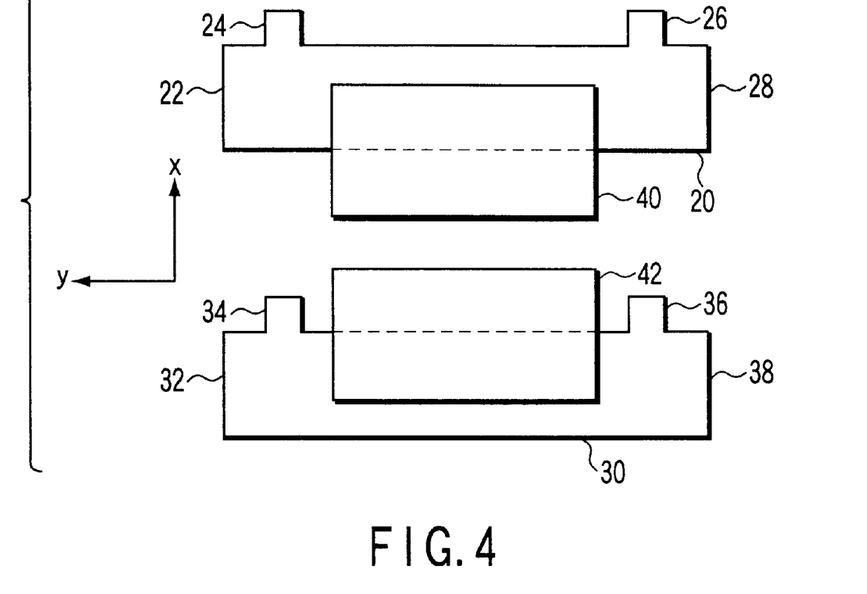
FIG. 4 illustrates an example of transferring a second-level pattern onto a first-level pattern.
Figure 5:
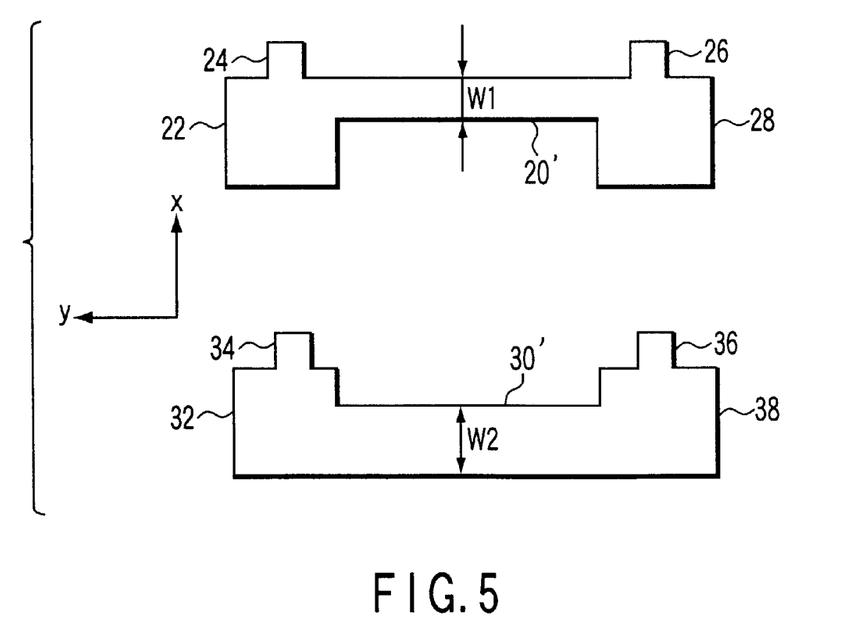
FIG. 5 illustrates the patterns after exposure in FIG. 4.

FIG. 4 illustrates a pattern before exposure and FIG. 5 illustrates the pattern after exposure.

The present invention is directed to measurement of the amount of misregistration on the basis of the same pattern density as that in actual devices. For this reason, unlike the aforementioned principles, there is a case where it cannot be determined from the same pattern whether the amount of misregistration is plus or minus. Thus, in the embodiment to be described below, a resistance measuring pattern is used to measure the amount of misregistration using a resistance measuring pattern on the basis of the following four-point measurement.

This measuring method will be described below with reference to a process flow of FIG. 3.

In FIG. 4, a first-level pattern 20 is formed with four terminals 22, 24, 26, and 28. Likewise, another first-level pattern 30 is formed with four terminals 32, 34, 36, and 38. These patterns are assumed to be of the same shape.

In step S1, these patterns 20 and 30 are subjected to exposure. That is, a first exposure process is performed on the first-level pattern 20 having the terminals 22, 24, 26, and 28 and the pattern 30 having the terminals 32, 34, 36, and 38. Next, a second exposure process is performed on second-level patterns 40 and 42.

Taking into consideration displacement to the plus side or minus side in the x direction of FIG. 4, the second exposure process is carried out with the patterns 40 and 42 placed in different locations on the patterns 20 and 30, respectively. That is, the pattern 40 is placed on the lower side of the pattern 20 and the pattern 42 is placed on the upper side of the pattern 30 as shown.

After that, the patterns 20 and 30 are developed in step S2 and then etched in step S3, thereby forming patterns 20' and 30' of different shapes as shown in FIG. 5. In this case, due to misregistration of the patterns 40 and 42 with respect to the patterns 20 and 30, the patterns 20' and 30' will have different widths, w1 and w2.

Next, in step s4, the resistance between the terminals 24 and 26 of the pattern 20' is measured. For example, with a current I supplied between the terminals 22 and 28, a voltage V1 developed between the terminals 24 and 26 is measured. Likewise, the resistance between the terminals 34 and 36 of the pattern 30' is measured. For example, with a current I supplied between the terminals 32 and 38, a voltage V2 developed between the terminals 34 and 36 is measured. In this case, since the patterns 20' and 30' have different widths of w1 and w2, it can be seen that the voltages V1 and V2 differ from each other.

Next, in step S5, the amount of misregistration is calculated from the measured values. In this case, the amount of misregistration Δx is given by $$\Delta x = \tfrac{1}{2}(\rho\,I\,l((1/V1)+(1/V2))) \quad (6)$$

where ρ is the sheet resistance of the patterns and l is the terminal-to-terminal distance of the patterns. Thus, by preparing two types of patterns 20' and 30' and measuring the amount of misregistration for each of them, errors in the case where the direction of misregistration is plus and minus can be avoided.

Apart from the aforementioned measurement method, the creation of patterns of different widths (only the first exposure process) would be effective for calibration purposes.

In the first embodiment, the first exposure process and the second exposure process are performed in succession. In this case, the pattern measurement is made using the same equipment. The stability of the equipment can be known from the resulting amount of misregistration.

However, it is contemplated that the first exposure process and the second exposure process may be carried out displaced in time or each of the first exposure process and the second exposure process may be performed by separate equipment.

Figure 6:
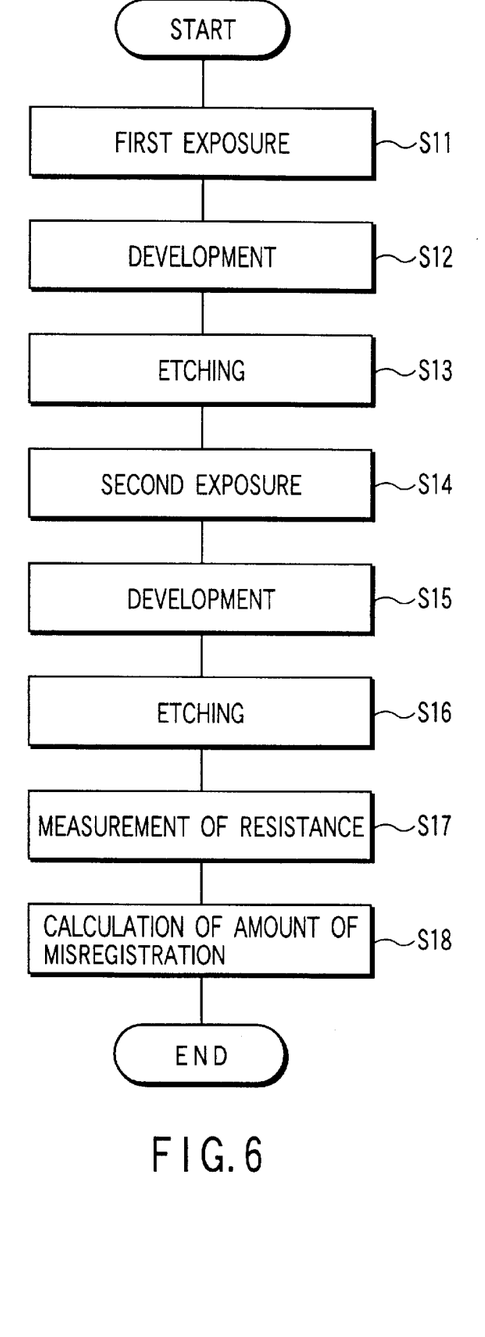
FIG. 6 is a process flow illustrating a method of electrically measuring the misregistration of patterns according to a modified version of the first embodiment of the present invention.

In such a case, the measurement is made in accordance with a process flow shown in FIG. 6. Here, the pattern to be measured is assumed to be identical to that shown in FIGS. 4 and 5.

In step S11, a first exposure process is performed on first-level patterns 20 and 30. That is, the first exposure process is performed on the pattern 20 having terminals 22, 24, 26 and 28 and the pattern 30 having terminals 32, 34, 36 and 38. After that, the first development process is carried out on the patterns 20 and 30 in step S12 and an etching process is then performed in step S13.

In subsequent step S14, a second exposure process is performed on second-level patterns 40 and 42. Taking into consideration displacement to the plus side or minus side in the x direction of FIG. 4, the second exposure process is carried out with the patterns 40 and 42 placed in different locations on the patterns 20 and 30, respectively. That is, the pattern 40 is placed on the lower side of the pattern 20 and the pattern 42 is placed on the upper side of the pattern 30 as shown.

After that, a second development process is performed on the patterns 20 and 30 in step S15 and an etching process is then performed in step S16.

Thus, as shown in FIG. 5, patterns 20' and 30' of different widths w1 and w2 are formed as shown in FIG. 5.

Next, in step S17, the resistance between the terminals 24 and 26 of the pattern 20' is measured. Further, in step S18, the amount of misregistration is calculated from the measured resistance value. The measurement and calculation in steps S17 and S18 are identical to those in steps S4 and S5 in FIG. 3 and the description thereof is therefore omitted.

There is the possibility that an amount of displacement (error) may be produced due to the transformation of the wafer or a change in the separate equipment when the first and second exposure steps are performed displaced in time because of an intervening process or processes or a certain lapse of time therebetween. According to the measurement method based on the process sequence of FIG. 6, such an error can be known and corrected.

A second embodiment of the present invention will be described next.

Figure 7:
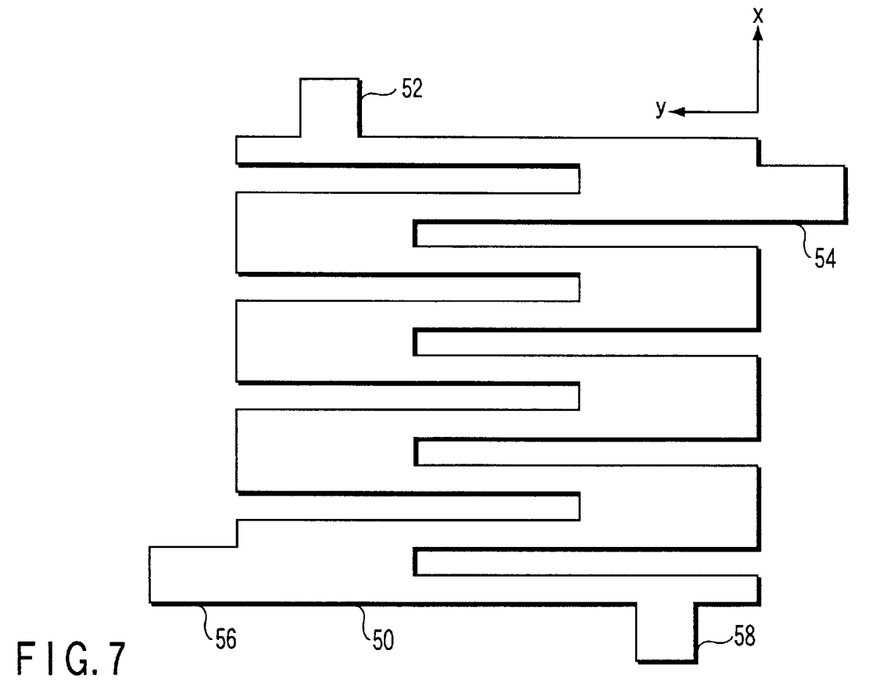
FIG. 7 illustrates a first-level pattern as a repeating pattern according to a second embodiment of the present embodiment.

Usually, semiconductor devices, such as LSI memories, have a very high pattern density. Because, in the present invention, misregistration is measured at substantially the same pattern density as those in actual semiconductor devices, in the second embodiment, the first-level pattern is formed as such a repeating pattern as shown in FIG. 7.

The number of repeated elements in the pattern 50 varies with the semiconductor device. The pattern is formed with terminals 52, 54, 56, and 58 for resistance measurement based on the four-point measurement.

Figure 8:
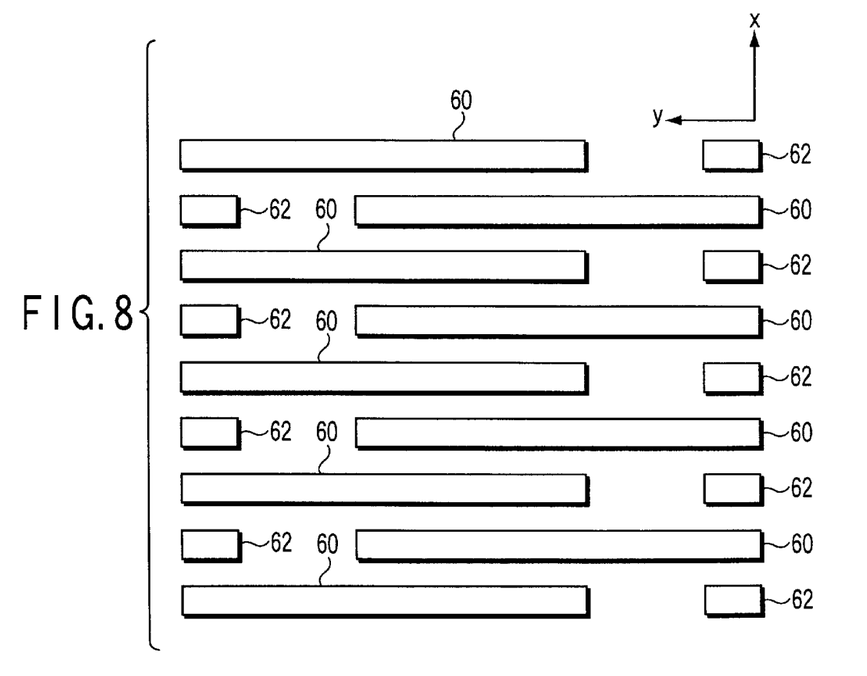
FIG. 8 illustrates a second-level pattern including main pattern elements and subpattern elements to be registered onto the first-level pattern of FIG. 7.

In contrast, a second-level pattern serving as a trimming pattern is formed as shown in FIG. 8. The second-level pattern consists of a plurality of sets each of a main pattern element 60 which is elongated in the y direction as shown and a subpattern element 62 shorter than the element 60.

Figure 9:
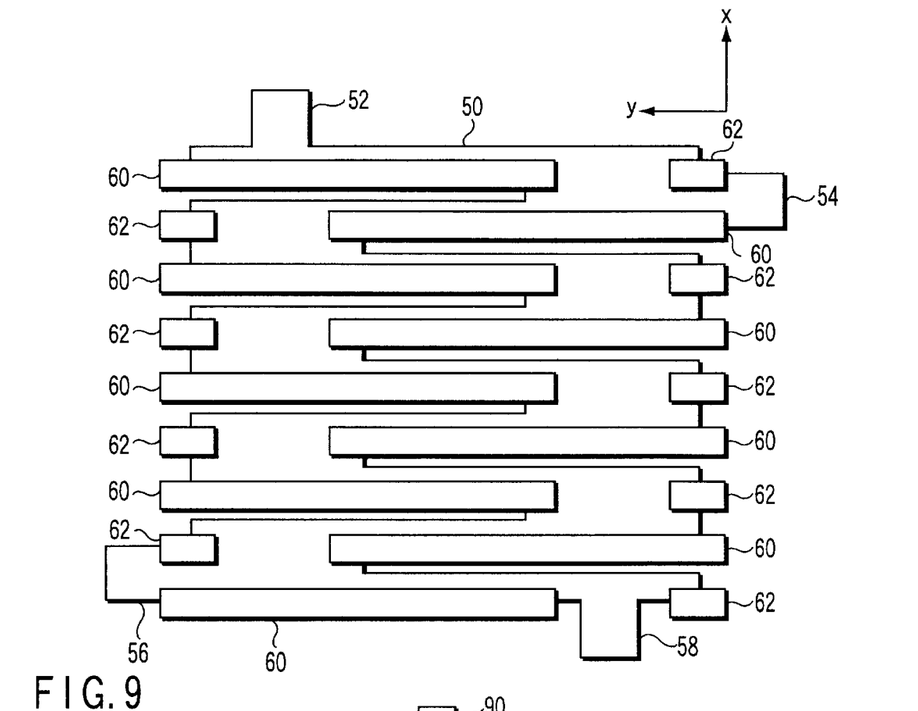
FIG. 9 illustrates the state where the second-level pattern has been registered onto the first-level pattern.

FIG. 9 shows a pattern configuration in which the second-level pattern, comprised of the main pattern elements 60 and the subpattern elements 62, has been transferred onto the first-level pattern 50. The areas of the first-level pattern on which the second-level pattern has been transferred are then etched to thereby complete a final pattern.

The reason why the second-level pattern is divided into the main pattern elements 60 and the subpattern elements 62 is as follows.

If the subpattern elements 62 were nonexistent and the second-level pattern were displaced in the y direction in FIG. 9, then the line width of a portion of the first-level pattern 50 in which it is folded back would vary. Therefore, the measurement in the x direction would be affected by the displacement in the y direction.

In contrast, if the subpattern element 62 is provided in the second-level pattern, then that portion of the first-level pattern will be kept fixed irrespective of the displacement of the first-level pattern in the y direction. Thus, since the resistance is not changed even in the presence of the displacement in the y direction, the measurement in the x direction is not affected by the displacement in the y direction.

In the final pattern configuration shown in FIG. 9, a current is supplied between the terminals 52 and 58, and a voltage developed between the terminals 54 and 56 is measured. The resistance is determined from the current and the voltage.

In this example, preparations may be made for two patterns: a pattern such that its line width increases when the displacement occurs in the plus direction, and a pattern such that its line width decreases when the displacement occurs in the minus direction. Then, an amount of displacement can be determined by comparing the two results obtained from the two patterns with a pattern separately prepared for calibration purposes. For example, assuming that an amount of displacement for the calibration pattern is ±0.5 µm and an amount of displacement obtained from the measurement is ±0.4 µm, an amount of misregistration is 0.1 µm.

Next, a third embodiment will be described.

In the third embodiment, the first- and second-level pattern are placed each of which has repeatability of pattern outside the measurement pattern.

For example, in the pattern shown in FIG. 2, the second-level pattern can be made of a plurality of pattern elements, not one element.

Figure 10:
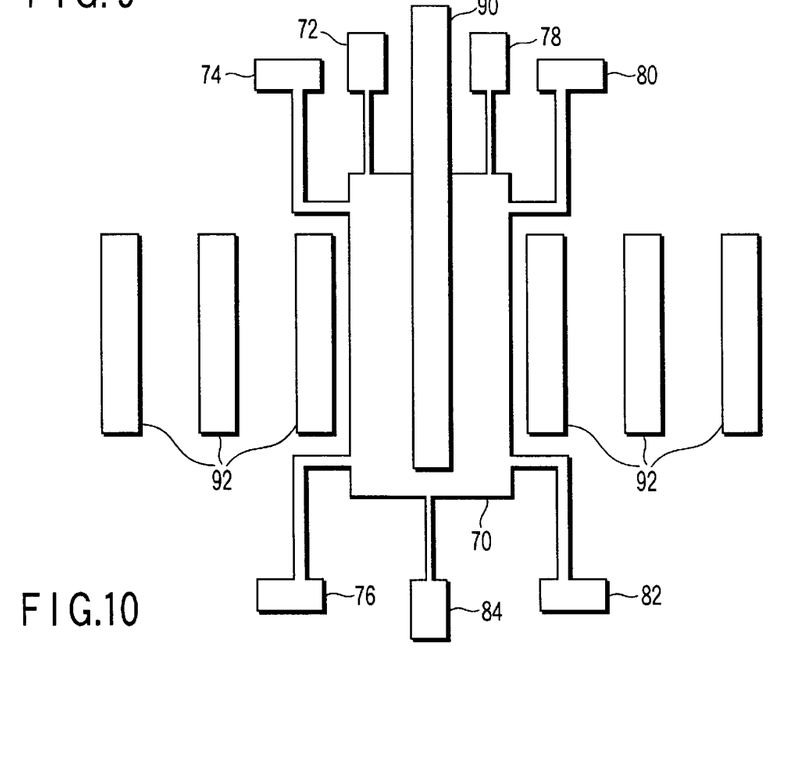
FIG. 10 illustrates a final pattern configuration according to a third embodiment of the present invention.

In FIG. 10, a first-level pattern 70 is formed to have a plurality of terminals 72, 74, 76, 78, 80, 82, and 84. A second-level pattern is then formed which has a main pattern 90 formed on the first-level pattern 70 and subpattern elements 92 formed on the both sides of the main pattern element. That is, the subpattern elements 92 are placed at a high density adjacent to the main pattern element 70, providing a pattern configuration close to an actual device pattern configuration.

In this embodiment, a current is supplied between the terminals 72 and 78 and then the resistances between the terminals 74 and 76 and between the terminals 80 and 82 are measured, thereby determining the line widths in the plus direction and the minus direction. An amount of misregistration is determined from the resulting line widths.

Here, a method of determining the line widths is described in "Electrical Characterization of AcrossField Lithographic Performance for 256 Mbit DRAM Technologies" by J. Iba, K. Hashimoto, R. Ferguson, T. Yanagisawa, D. Samuels, SPIE Proceedings, vol. 2512, p218.

Figures 11A, 11B, 12:
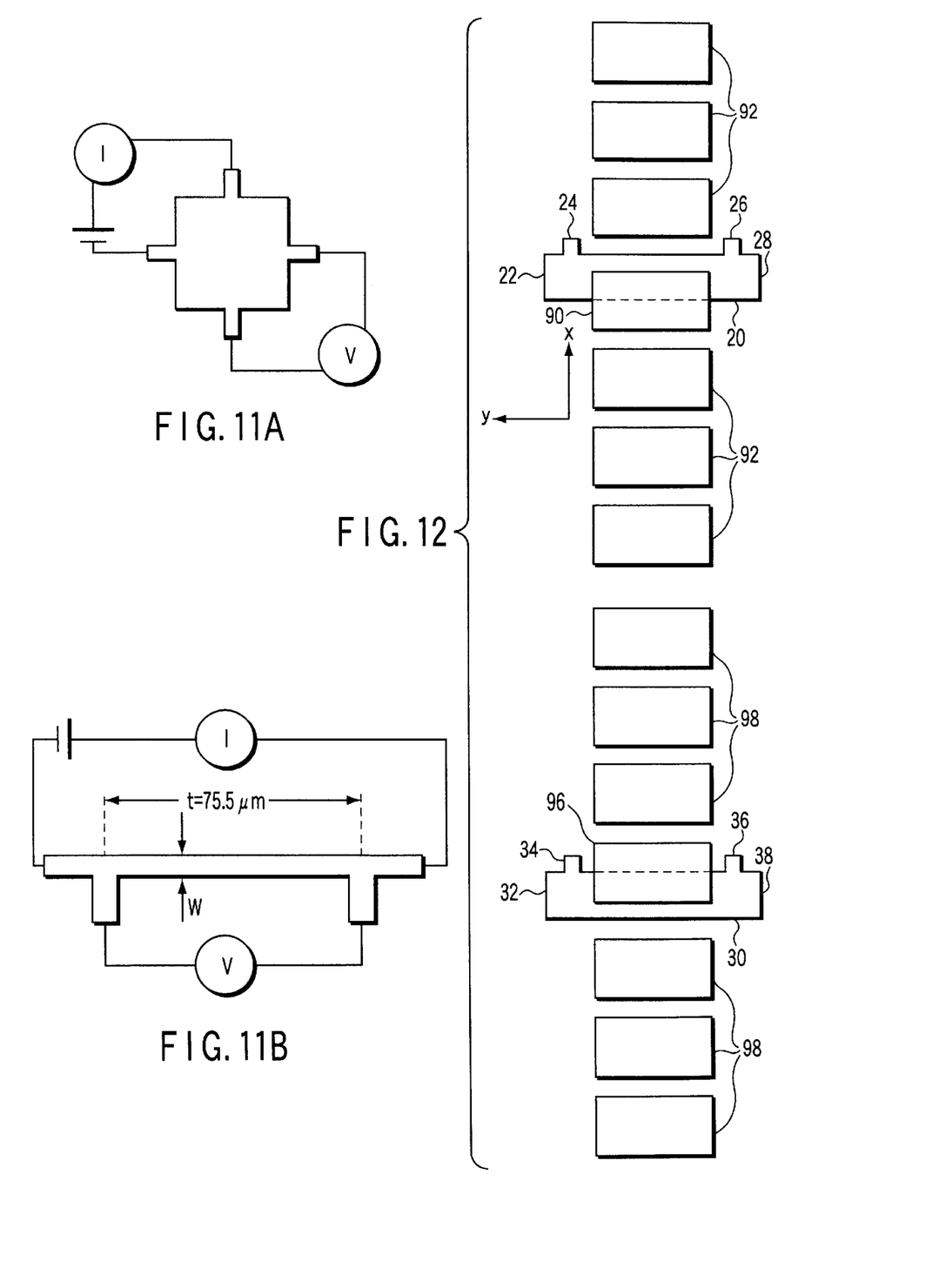
FIG. 11A illustrates an example of a van der Pauw structure.
FIG. 11B illustrates an example of a four-point probe structure.
FIG. 12 illustrates a final pattern configuration according to a modified version of the third embodiment of the present invention.

FIGS. 11A and 11B illustrate the van der Pauw method and the four-point measurement. First, based on the van der Pauw method, the sheet resistance Rs is calculated to be $$Rs=(\pi/\ln 2)\cdot(V/I) \quad (7)$$

where V is a voltage between terminals and I is a current between terminals shown in FIG. 11A. Using equation (7), the four-point measurement shown in FIG. 11B allows the line width W to be calculated by $$W=Rs\cdot t\cdot(I/V) \quad (8)$$

where t is the distance between the terminals. In the case of the terminals shown in FIG. 11B, t is 75.5 µm.

The third embodiment allows displacements to the plus and minus sides in the x direction to be measured using one pattern. Two or more pattern elements can be added to a pattern that allows measurement of displacement only in one direction like the pattern shown in FIGS. 4 and 5 to provide desired results.

FIG. 12 illustrates a modified version of the third embodiment.

In FIG. 12, a first-level pattern has a pattern element formed with four terminals 22, 24, 26 and 28 and a pattern element 30 formed with four terminals 32, 34, 36 and 38. These pattern elements 20 and 30 are of the same shape. The elements 20 and 30 need not take the same positions as is shown in FIG. 12.

A second-level pattern has a main pattern element 90 formed on the pattern element 20 and adjacent pattern elements 92 formed on both sides of the main pattern element 90. The second-level pattern further has a main pattern element 96 formed on the first-level pattern element 30 and adjacent pattern elements 98 formed on both sides of the main pattern element 96.

A first exposure process is performed on the first-level pattern and a second exposure process is performed on the second-level pattern.

The subsequent measurement is the same as in the first embodiment and the description thereof is omitted. The resulting pattern configuration is the same as that in FIG. 5.

Due to the aberration of the projection optical system, the pattern will shift its transferred location according to its density level. In the aforementioned article by I. J. Stemp, K. H. Nicholas, and H. E. Brockman, an isolated pattern is used to measure an amount of displacement and its density differs from that of an actual device pattern. For this reason, the measured values will not be trustworthy.

In contrast, the aforementioned embodiments allows for measurements at the same density as that of actual device patterns; thus, the level of registration of actual patterns can be measured with precision.

The measurement of misregistration of patterns according to the present invention was described taking conductive patterns by way of example. This is not restrictive. The present invention is also applicable to interconnects, gates, and contact holes to be aligned with the gates.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of electrically measuring misregistration of patterns comprising the steps of:
    forming a first-level measurement pattern of a conductive material, each pattern element having a plurality of terminals;
    forming a second-level measurement pattern having at least two pattern elements formed in substantially the same pattern density as a density of actual semiconductor devices, each pattern element of the second-level measurement pattern being affixed on top and exceeding the boundary of the first-level measurement pattern;
    etching the first-level measurement pattern according to the second-level measurement pattern;
    measuring electrical resistance between the terminals of each pattern element of the first-level measurement pattern; and
    calculating an amount of misregistration between the first-level measurement pattern and the second-level measurement pattern from the measured resistance value.

2. The method according to claim 1, wherein, in the step of measuring electrical resistance, the electrical resistance is measured using a four-point measurement.

3. A method of electrically measuring misregistration of patterns "Y comprising the steps of:
    forming a first-level measurement pattern of a conductive material, the first-level measurement pattern having a plurality of terminals;
    forming a second-level measurement pattern having at least two pattern elements formed in substantially the same pattern density as a density of actual semiconductor devices, each pattern element of the second-level measurement pattern being affixed on top and exceeding the boundary of the first-level measurement pattern;
    etching the first-level measurement pattern according to the second-level measurement pattern;
    measuring electrical resistance between the terminals of the first-level measurement pattern; and calculating an amount of misregistration between the first-level measurement pattern and the second-level measurement pattern from the measured resistance value;
    wherein the step of forming the second-level measurement pattern forms each pattern element of the second-level measurement pattern such that a pattern width of the first-level measurement pattern, etched according to one of the pattern elements, increases when a displacement occurs in a plus direction of an axis, while the pattern width of the first-level measurement pattern, etched according to another of the pattern elements, decreases when the displacement occurs in a minus direction of the axis.

4. The method according to claim 3, wherein, in the step of measuring electrical resistance, the electrical resistance is measured using a four-point measurement.

5. A method of electrically measuring misregistration of patterns comprising the steps of:
    forming a first-level measurement pattern of a conductive material, the first-level measurement pattern having a plurality of terminals;
    forming a second-level measurement pattern having at least two pattern elements formed in substantially the same pattern density as a density of actual semiconductor devices, each pattern element of the second-level measurement pattern being affixed on top and exceeding the boundary of first-level measurement pattern;

etching the first-level measurement pattern according to the second-level measurement pattern;

measuring electrical resistance between the terminals of the first-level measurement pattern; and calculating an amount of misregistration between the first-level measurement pattern and the second-level measurement pattern from the measured resistance value;

wherein the step of forming the second-level measurement pattern forms each pattern element of the second-level measurement pattern such that a pattern width of the first-level measurement pattern, etched according to one of the pattern elements, increases when a displacement occurs in a plus direction of an axis, while the pattern width of the first-level measurement pattern, etched according to another of the pattern elements, decreases when the displacement occurs in a minus direction of the axis;

wherein the step of forming the first-level measurement pattern forms at least two pattern elements, each of which is to be etched in a different shape according to each pattern element of the second-level measurement pattern.

6. A method of electrically measuring misregistration of patterns comprising the steps of:

forming a first-level measurement pattern of a conductive material, the first-level measurement pattern having a plurality of terminals;

forming a second-level measurement pattern having at least two pattern elements formed in substantially the same pattern density as a density of actual semiconductor devices, each pattern element of the second-level measurement pattern being affixed on top and exceeding the boundary of the first-level measurement pattern;

etching the first-level measurement pattern according to the second-level measurement pattern;

measuring electrical resistance between the terminals of the first-level pattern and the second-level measurement pattern from the measured resistance value;

wherein the step of forming the second-level measurement pattern forms each pattern element of the second-level measurement pattern such that a pattern width of the first-level measurement pattern, etched according to one of the pattern elements, increases when a displacement occurs in a plus direction of an axis, while the pattern width of the first-level measurement pattern, etched according to another of the pattern elements, decreases when the displacement occurs in a minus direction of the axis;

wherein the step of forming the second-level measurement pattern forms each pattern element divided in a direction perpendicular to said axis into a main pattern element and a sub pattern element apart from each other a predetermined distance.

\* \* \* \* \*